United States Patent [19]
Dranchak et al.

[11] Patent Number: 5,953,214
[45] Date of Patent: Sep. 14, 1999

[54] DUAL SUBSTRATE PACKAGE ASSEMBLY COUPLED TO A CONDUCTING MEMBER

[75] Inventors: David William Dranchak, Endwell; Robert Joseph Kelleher; David Peter Pagnani, both of Endicott; Patrick Robert Zippetelli, Endwell, all of N.Y.

[73] Assignee: International Business Machines Corporation, Armonk, N.Y.

[21] Appl. No.: 08/999,841

[22] Filed: May 24, 1996

Related U.S. Application Data

[63] Continuation of application No. 08/206,807, Mar. 7, 1994, abandoned.

[51] Int. Cl.[6] .............................. H05K 1/14; H01R 23/68
[52] U.S. Cl. .................. 361/767; 361/784; 361/785; 361/790; 361/791; 361/803; 257/686; 257/697; 439/591; 324/755
[58] Field of Search ..................................... 361/742, 767, 361/770, 825, 784–795, 803, 804; 439/91, 591; 257/685, 686, 697; 324/755, 765

[56] References Cited

U.S. PATENT DOCUMENTS

| | | | |
|---|---|---|---|
| 3,795,037 | 3/1974 | Luttmer | 29/883 |
| 3,954,317 | 5/1976 | Gilissen et al. | 439/591 |
| 4,074,342 | 2/1978 | Honn et al. | |
| 4,445,112 | 4/1984 | Haville | 341/9 |
| 4,793,814 | 12/1988 | Zifcak et al. | 439/66 |
| 4,801,992 | 1/1989 | Golubic | 257/668 |
| 4,882,656 | 11/1989 | Menzies, Jr. et al. | 361/734 |
| 4,882,657 | 11/1989 | Braun | 439/91 |
| 5,006,922 | 4/1991 | McShane et al. | 257/697 |
| 5,010,445 | 4/1991 | Weinold | 361/728 |
| 5,036,431 | 7/1991 | Adachi et al. | 361/803 |
| 5,061,192 | 10/1991 | Chapin et al. | 439/66 |
| 5,076,794 | 12/1991 | Ganthier | 439/70 |
| 5,138,430 | 8/1992 | Gow, III et al. | 257/712 |
| 5,148,265 | 9/1992 | Khandros et al. | 257/773 |
| 5,155,905 | 10/1992 | Miller, Jr. | 29/843 |
| 5,237,743 | 8/1993 | Busacco | 29/885 |
| 5,248,262 | 9/1993 | Busacco et al. | 439/66 |
| 5,257,165 | 10/1993 | Chiang | 361/748 |
| 5,324,205 | 6/1994 | Ahmad et al. | 439/66 |
| 5,395,252 | 3/1995 | White | 439/66 |
| 5,403,194 | 4/1995 | Yamazaki | 439/66 |
| 5,479,319 | 12/1995 | Werther | 361/784 |

FOREIGN PATENT DOCUMENTS 1121011   3/1982   Canada.

*Primary Examiner*—Leo P. Picard
*Assistant Examiner*—John B. Vigushin
*Attorney, Agent, or Firm*—Ratner & Prestia; Lawrence R. Fraley

[57] ABSTRACT

An electronic package assembly for being electrically connected to a conducting member (e.g., a printed circuit board) wherein the assembly includes a pair of substrates. The first substrate includes opposing circuit patterns, those on one surface being of higher density and thus adapted for having high density electronic devices mounted thereon. This high density pattern is electrically coupled to the lesser density second pattern which is connected to contacts of a second substrate. These contacts are of the lesser density also, and extend through a dielectric member for being coupled to conductors (e.g., copper circuit pads) on the conducting member. Ready separability of various parts of the assembly is thus assured.

18 Claims, 3 Drawing Sheets

DUAL SUBSTRATE PACKAGE ASSEMBLY COUPLED TO A CONDUCTING MEMBER

This application is a continuation of prior complete application Ser. No. 08/206,807, filed Mar. 7, 1994, now abandoned.

TECHNICAL FIELD

The invention relates to the field of electronic package assemblies and particularly to package assemblies for connecting at least one active or passive electronic component (such as an integrated circuit, transistor, resistor, or capacitor) to a conducting (electrical circuit) member such as a printed circuit board, a circuit module or the like. Even more particularly, the invention relates to package assemblies of this type which may be used in the information handling system (computer) environment.

BACKGROUND OF THE INVENTION

The current trend in electronic package assembly design, particularly for those assemblies utilized in the computer field, is to provide a high density, high wirability, and highly reliable assembly that provides both the connection and the interconnection of circuit devices which form important parts of the computer. High density and high wirability are essential for such an assembly to provide the necessary performance for a given function in a minimal amount of space. High reliability is essential due to potential end product failure, should vital misconnections of these devices occur. Further, to assure effective repair, upgrade, and/or replacement of various components of the system (i.e., connectors, integrated circuits (chips), boards, modules, etc.), it is also highly desired that such assemblies be separable and reconnectable in the field within the final product, as well as tolerant of dust and fibrous debris. Such a capability is also desirable during the manufacturing process for such products, e.g., to facilitate testing.

Other methods of performing similar types of functions are presently available but have limitations in functionality, performance, and/or price. In one such example, the substrate is a typical printed circuit board made of fiberglass reinforced epoxy resin. Because the pins used to plug the package assembly into a mating socket are directly attached through the substrate (typically by means of a pinning process), many compromises must be made. For example, since the pins protrude through the top surface of the substrate, most of the electronic and mechanical components must be located within the boundaries formed by the rows of pins around the perimeter of the package assembly. The wirability of the substrate is compromised due to the relatively large diameter of plated-through holes needed for the pins. This blocks a significant number of the potential wiring channels. Furthermore, a design requiring a full array of pins (no depopulation to form just a perimeter array of pins) would be extremely difficult to do because the protruding pins would interfere with the placement of all but the smallest of components on the top surface. A package application may desire a full array of pins for many reasons, including the need for more external connections, the desire to minimize the space used by the package assembly, and the desire to improve performance by having a signal or power connection exit directly down to the printed circuit structure, as opposed to having it fan out to the perimeter on the substrate and then exit down to the printed circuit structure.

Examples of a second method of performing a similar function involve the use of a substrate which consists of a known material such as alumina or glass-ceramic and typically has only one or two wiring layers, which are on the same side as the components. The limitations of this type of carrier compared to the disclosed invention are higher cost, limited wirability (for the same reasons as in the previous example), the inability to support a full area array of pins, and the fact that it is difficult for such glass or ceramic-based carriers to support the use of pin-in-hole components.

Examples of a third method of performing the above function involve the use of a substrate which also consists of a material such as alumina or glass-ceramic but usually has multiple wiring layers. This type of structure is also known as a multilayer ceramic module. This type of structure overcomes the limitation of limited wirability since it has both multiple wiring layers as well as individually-attached pins used for the connector means. The pins are attached (typically brazed) to (as opposed to extending through) the bottom of the substrate. But, the above limitations, including primarily the difficulty of this material to effectively support the use of pin-in-hole components and a significantly higher cost (especially for sizes greater than 40 millimeters) remain.

Attention is directed to U.S. Pat. Nos. 5,036,431, 5,155,905 and 5,010,445 for various techniques for providing a package assembly for connecting and interconnecting a variety of electronic components to an electrical circuit member. As understood from a reading of these patents, the techniques described therein include many of the aforedefined disadvantages, e.g., limited wirability, inability to support a full area array of pins, the inability to support the use of pin-in-hole components, as well as others, e.g., relatively complex design, costly to manufacture, etc.

In U.S. Pat. No. 5,248,262, issued Sep. 28, 1993, and entitled "High Density Connector" (inventors: R. A. Busacco et al.), there is defined an electrical connector with electrical contacts, including those combining flexible circuitry and an associated spring means, adapted for use as part of one embodiment of the invention. U.S. Pat. No. 5,248,262, assigned to the same assignee as the present invention, is incorporated herein by reference.

It is believed that a package assembly capable of effectively and reliably connecting active as well as passive electronic components to an electrical circuit member, wherein such connections are repeatable (such that connection and reconnection can readily occur), and which provides the other advantageous features discernible from the following description would constitute a significant advancement in the art.

DISCLOSURE OF THE INVENTION

It is, therefore, a primary object of the present invention to enhance the electronic package assembly art.

It is another object of the invention to provide an electronic package assembly capable of connecting both active and passive electronic components to an electrical circuit member in an effective and reliable manner, which connections can be readily separated and repeated if desired.

It is yet another object of the invention to provide such an assembly which is relatively inexpensive to manufacture and also of a relatively simplistic design.

In accordance with one aspect of the invention, there is provided an electronic package assembly for being electrically coupled to a conducting member having a plurality of first conductors, the assembly comprising a first substrate including a first surface having an electrical pattern thereon of a first density and a second surface having an electrical pattern thereon of a second density less than the first density, the electrical patterns on the first and second surfaces being electrically interconnected, at least one electronic component electrically coupled to the electrical pattern on the first surface, and a second substrate including a dielectric member having a plurality of second conductors therein and adapted for being positioned on the conducting member, selected ones of the second conductors of the second substrate being coupled to the electrical pattern on the second surface of the first substrate and of a similar density as the second density, the second conductors adapted for being electrically coupled to respective ones of the conductors of the first conducting member when the second substrate is positioned thereon.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
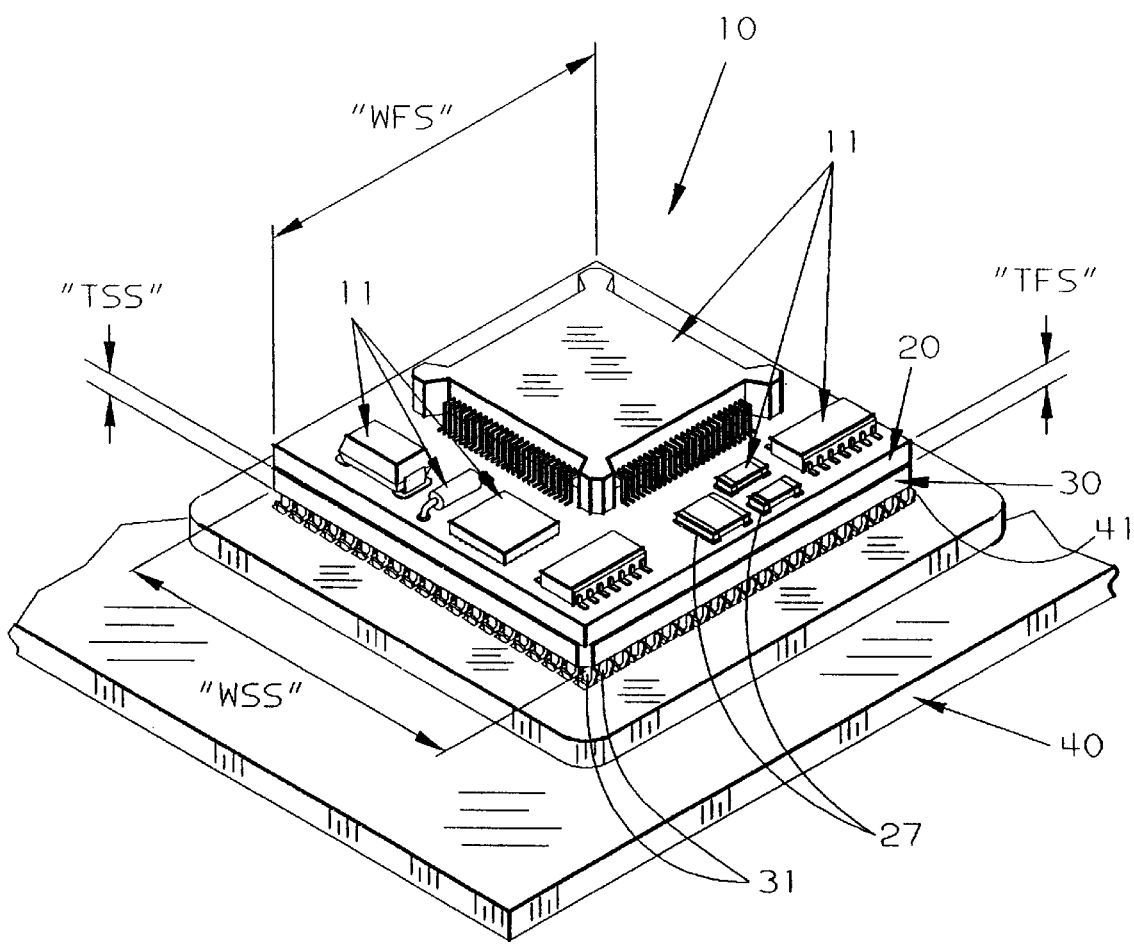
FIG. 1 is a perspective view of a package assembly according to one aspect of the invention.

In FIG. 1, there is shown an electronic package assembly 10 for being electrically coupled to a conducting member 40, in accordance with one embodiment of the invention. Package assembly 10 comprises a first substrate 20, a second substrate 30 including at least one (and preferably a plurality of) second conductor(s) 31, and at least one (and preferably several) electronic component(s) 11.

By the term second substrate is meant to define a piece of insulative material with one or more conductive elements (e.g., second conductors) that may be implemented in different form factors depending on the embodiment. Examples may include a dielectric layer that retains one or more pins (the combination of the dielectric layer and pins being also known in the art as a pinned array header), a combination similar to such a dielectric-pin example except that the dielectric layer may also include additional circuit elements such as lines, pads, conductive vias, plated through holes, etc. to provide additional wirability and/or functionality, and thirdly, a housing for an area array interposer-style connector. It is understood that the second conductors used in these examples may differ considerably, depending on the particular implementation of the second substrate (30).

Figure 2:
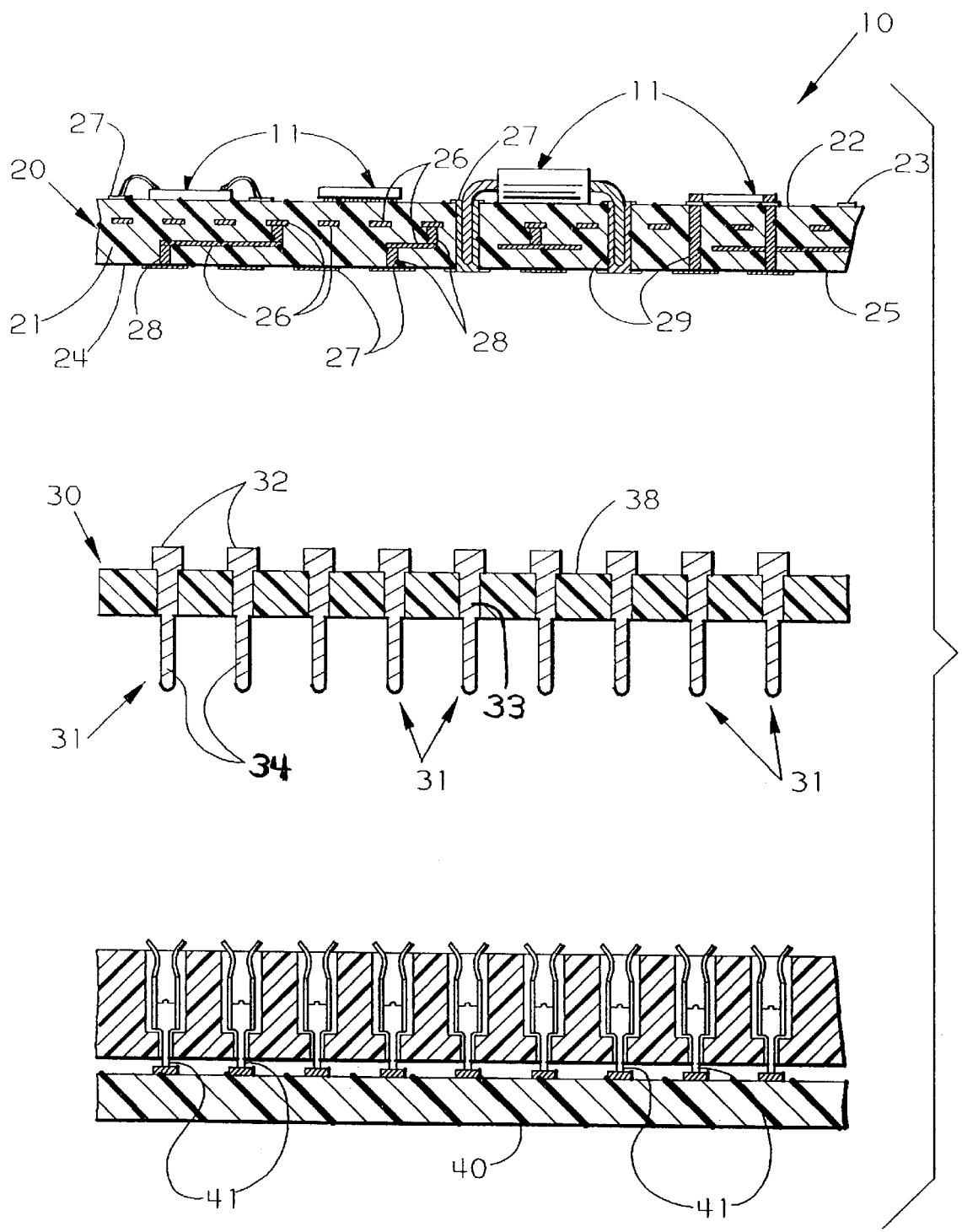
FIG. 2 is a partial elevational side view, in section, of the assembly of FIG. 1, and on a much larger scale.

A more detailed illustration of package assembly 10, taken in section, is seen in FIG. 2. First substrate 20 includes a first surface 22 having an electrical pattern 23 thereon of a first density and a second, opposite surface 24 having an electrical pattern 25 thereon of a second density less than the first density.

By the term "density" is meant to define the linear density (i.e. the number of input/output (I/O) contacts per inch in one linear direction for a component or feature pattern such as an array of pads). In a typical example, a component known in the art as a quad flat pack, which may typically be located on first surface 22, may have conductive leads on about 0.020 to 0.025-inch centers on each of its four sides. But, an array of pads on the second surface 24, which may be used to attach to second conductors 31 in the second substrate 30 that might then be plugged into first conductors 41 on conducting member 40, might typically be on 0.100-inch centers (e.g., in what will be referred to as X and Y directions).

The electrical pattern 23 on first surface 22, which may include a series of one or more lines and/or pads, is intended to provide interconnection between one or more electronic components 11. Such connections may also be achieved using internal circuit elements such as internal lines (26), conductive vias (28), plated through holes (29), etc.

Electronic components 11 may be of different varieties and form factors and, although located primarily on the first surface 22 of first substrate 20, may be located on any combination of first surface 22, second surface 24, and even around the peripheral edges of first substrate 20. Examples of electronic components 11 include resistors, capacitors, transistors, bare semiconductors, semiconductors in packages (such as quad flat packs and dual inline packages), and semiconductors packaged on multi-chip carriers. These components 11 fall into three general form factors based on how these are attached to the substrate: (A) pin-in-hole, (B) surface-mount, and (C) direct-chip-attach (including wirebond and flip-chip-attach). The components 11 may be attached to one of the electrical patterns on surface 22 by methods known in the art, such as soldering, conductive adhesive, wirebonding, and brazing. Package assembly 10 may also provide support for the inclusion of mechanical components such as connectors, heatsinks, and actuation/clamping means. Although the primary purpose of package assembly 10 is to provide both signal and power connections from one or more electronic components 11 to a conducting member 40, such as a printed circuit board, a circuit module or the like, it is understood that this assembly is also capable of providing signal and power connections between components 11 on assembly 10.

The electrical pattern 25 on the second surface 24 of first substrate 20, which may also include a series of one or more lines and/or pads, is comprised primarily of a series of pads 27 that are intended to provide direct electrical contact from first substrate 20 to second conductors 31 located in second substrate 30. Electrical pattern 25 may also provide interconnection to, from, and between one or more electronic components 11 on the second surface 24 of first substrate 20, if such components are positioned thereon (these are not shown in FIG. 2 but could be similar to those on surface 22).

Interconnections between the electrical patterns on the two surfaces 22 and 24 of first substrate 20 (and also to any additional internal layers) is preferably achieved using internal lines 26, pads 27, conductive vias 28 and/or plated-through holes 29.

In a preferred embodiment, first substrate 20 is a printed circuit board of a dielectric material 21 such as fiberglass reinforced epoxy resin, Teflon (a trademark of E. I. DuPont deNemours & Co., Inc., Wilmington, Del.), Kapton (a trademark of E. I. DuPont deNemours & Co., Inc., Wilmington, Del.), or Upilex (a trademark of ICI Americas, Wilmington, Del.). Electrical patterns both on and within first substrate 20 as previously described, which provide the majority of the interconnections both to and within first substrate 20, are comprised of an electrically conductive material such as copper (or similar metallic material including e.g., copper alloys, aluminum, etc. as well as other materials such as conductive inks, etc.). Significantly, copper is the preferred material for electrical patterns because of its relatively low electrical and thermal resistivity compared to other commonly used materials. In other implementations such as in ceramic-based substrates, these horizontal and vertical connections may also exist but would most likely be implemented by different means and materials.

Significantly, fiberglass reinforced epoxy resin has several advantages over many other dielectric materials for many applications since it is rather inexpensive compared to such other materials, while allowing for very high wirability through the use of fine line circuitry (i.e. narrow printed circuit lines and spaces along with small diameter conductive vias and plated-through holes). In addition, a fiberglass reinforced epoxy resin card or board easily allows the inclusion of many different form factors of electronic component types including: (a) pin-in-hole, (b) surface-mount, and (c) direct-chip-attach (implemented through known methods includingwirebond and flip-chip-attach) as well as mechanical components. This is a significant advantage over ceramic-based carriers. Furthermore first substrate 20 may provide excellent performance both for power and signal distribution since it has all of the advantages and capabilities of typical printed circuit structures available to it.

In one example of the invention, first substrate 20 may possess width and length dimensions ("WFS", FIG. 1) of about 2.0 inches each. This substrate may also possess a thickness dimension ("TFS", FIG. 1) of only about 0.062 inch.

Electronic package assembly 10 further includes a second substrate 30, which, in a preferred implementation of this embodiment, is also of fiberglass reinforced epoxy resin and has a coefficient of thermal expansion substantially similar to that of first substrate 20, and includes at least one (and preferably a plurality of) second conductor 31. Significantly, it is preferable that the coefficient of thermal expansion of second substrate 30 be as close as possible to that of first substrate 20, thus ensuring the mechanical integrity of the overall electronic package assembly 10. Second substrate 30 further includes at least one and preferably an array of second conductors 31 inserted therein.

In the preferred embodiment, second conductors 31 are individual pins, that may be frictionally positioned in openings in second substrate 30 by methods well known in the art. In one example, a total of 160 such pins may be utilized. Second conductors 31, which may be comprised of a conductive material such as brass or phosphor bronze and consist of a head 32, a body 33, and a tail 34, may be formed for example by a screw machine. The head 32 is preferably round, includes a flat top surface, and has a diameter slightly larger than that of the opening that this conductor is being positioned in. The body 33 typically includes barbs, grooves, or ridges (not shown) on the outer surface to provide better retention of the second conductor 31 once it is inserted in the opening of second substrate 30. Tail 34 typically is smooth and uniform in diameter, which facilitates insertion into a plated-through-hole or a pin-grid-array socket (FIG. 2).

In one example of the invention, second substrate 30 may possess width and length dimensions ("WSS", FIG. 1) of about 1.7 inches each. This substrate may also possess a thickness dimension ("TSS", FIG. 1) of only about 0.062 inch. The second substrate may thus be somewhat smaller in overall size than substrate 20, and preferably of a similar thickness.

It should be noted that although there are no electrical patterns either on, and/or within second substrate 30 in the embodiment of FIG. 2 (as there are with first substrate 20), the use of said internal and/or external patterns is well within the scope of this invention.

In a preferred embodiment, heads 32 of second conductors 31 within second substrate 30 are raised above the upper surface (38) of second substrate 30 as shown in FIG. 2. This is to prevent the entrapment of contaminants as well as to aid in the removal of the same during assembly wherein processes such as soldering may be used. In other embodiments, heads 32 may be mounted flush with, or slightly below the surface 38 to improve aspects of the invention such as to simplify particular assembly processes, etc. The diameter of the heads 32 may be varied either from application to application or even within an application to meet particular needs. A larger diameter head 32 may make the attachment to first substrate 20 easier or more robust by increasing the contact area between the two, but a smaller diameter head 32 may increase the wirability of circuitry on the electrical pattern 25 on the second surface 24 of first substrate 20.

If a depopulated array of second conductors 31 (e.g., only the outer rows of a 289 pin count array (e.g., in a 17 by 17 pattern)) are used, the center section of second substrate 30 may be removed to allow the placement of additional components 11 on the second surface 24 of the first substrate. This allows for true three-dimensional electronic packaging.

In a preferred embodiment, second substrate 30 helps to maintain both the uniform spacing of tails 34 and the uniform height of the top surface of heads 32 over the entire array of second conductors 31. The former aids in ensuring the successful connection of second conductors 31 to first conductors 41 in conducting member 40, while the latter aids in the attachment of second conductors 31 to the electrical pattern 25 on the second surface 24 of first substrate 20.

Second conductors 31 in second substrate 30 may be attached to pads 27 on electrical pattern 25 by clamping means (not shown) but would preferably be attached by a more permanent method, such as soldering, conductive adhesive, or brazing. In a preferred embodiment, soldering is used. It is significant to note that the inclusion of second substrate 30 as a carrier for the individual second conductors 31 greatly enhances the manufacturability of electronic package assembly 10 since it allows all of the second conductors 31 to be attached to first substrate 20 as a single surface-mount component. Preferably, conductors 31 are attached at the same time as the surface-mount components 11, e.g., using a known method such as double-sided, double-pass infrared solder reflow. To further aid in such an assembly process, it is preferred to allow at least a small portion of the second substrate to be free of second conductors 31 to thereby facilitate handling by assembly equipment (e.g., a pick-and-place tool).

It is significant to note that instead of attaching second conductors 31 through the first substrate 20, as previously described in many previous structures, electronic package assembly 10 allows the placement of electronic components 11 independent of the location of such second conductors.

The interconnection of electronic package assembly 10 to conducting member 40 is intended to be made primarily by the second conductors 31 of the second substrate 30 being electrically coupled to first conductors 41 within conducting member 40. These interconnections may be of the permanent variety (solder, conductive paste, etc.), but are preferably field-separable. The term field-separable is used to denote the idea of being able to disconnect and then later reconnect, with a high degree of reliability, two individual parts of electronic equipment that have left the manufacturing location and may be in service elsewhere.

The implementation of second conductors 31 and first conductors 41 greatly depends on whether interconnections are of the permanent or field-separable variety. If these are of the permanent variety, second conductors 31 may comprise pins (possibly solder-covered), solder spheres, solder bumps, etc., while first conductors 41 may comprise printed circuit pads, solder buckets, solder bumps, etc. If the interconnections are of the field-separable variety, second conductors 31 may comprise pins (preferably plated with corrosion-resistant, sound conducting metallic material such as nickel, gold, silver, palladium, etc. on at least the portion thereof used to make contact), conductive contact members in an interposer-style connector, etc., while first conductors 41 may comprise sockets designed to mate with such pins or contacts.

In a preferred embodiment of a field-separable structure, the series of second conductors 31 in second substrate 30 are on approximately 0.100-inch centers (e.g., in what will be referred to as X- and Y-directions) and are intended to align with and be positioned within a series of first conductors 41 in a pin grid array socket (preferably of the zero insertion force type). Such a socket (e.g., as in FIG. 2), is electrically connected (preferably through a process such as by soldering) to conducting member 40 (a printed circuit structure such as a board, card, or module), thus completing the interconnection of electronic components 11 to conducting member 40.

It is possible that if second substrate 30 is very thin, (i. e. a 0.005 inch thick layer of Kapton), this layer could be removed once the second conductors 31 had been attached to first substrate 20. Use of this type of structure, however, is not typically recommended for applications in which electronic package assembly 10 may be subjected to repeated insertions and removals from conducting member 40 due to the possible fatigue on the solder joints as well as possible bending of conductors 31. To further enhance the connectivity of electronic package assembly 10, additional interconnections may be made through connectors or cables (not shown) located on and electrically coupled to the electrical patterns 23 and 25.

One example of how electronic package assembly 10 may be used is to allow a specific component in its surface-mount package to match the identical pinout as its pin-grid-array version. This gives electronic package assembly 10 the capability of allowing surface-mount components to be "backward compatible" with pin-grid-array sockets on printed circuit structures. This may be desirable for many reasons, including situations where the pin-grid-array version of a component is not readily available, where the pin-grid-array version is much more expensive, or where it is desirable to upgrade an existing circuit by substituting a superior alternative (better performance, lower power consumption, lower price, etc.) while still maintaining pin compatibility.

Electronic package assembly 10 may have an additional benefit to manufacturers of electronic systems such as personal computers. It is common practice for a manufacturer to solder a lower-function, less-expensive, surface-mount integrated circuit (for example, a microprocessor) to a system board next to a upgrade socket designed to provide the same or similar function. If the cost of electronic package assembly 10 is relatively low, a manufacturer may benefit by packaging the original surface-mount integrated circuit on such an electronic package assembly because doing so would gain back valuable real estate on the system board as well as aid the manufacturer in implementing a build-to-order strategy.

Although not specifically shown, voltage regulation means may be included on first substrate 20 to further enhance the capabilities of electronic package assembly 10. One example of such application to the computer industry is for the support of 3.3-volt (or other non-5-volt) semiconductors in personal computers. The power supplies in many personal computers have a 5-volt output. Therefore, the inclusion of voltage regulation means on electronic package assembly 10 allows for the use of newer 3.3-volt semiconductors in existing systems. Furthermore, it allows electronic package assembly 10 to simultaneously support various types of semiconductors that have different voltage requirements (for example 3.3 and 5 volts) while requiring only a single voltage (for example 5 volts) input. This may be accomplished without a degradation in the power distribution performance through the inclusion and use of one or more voltage planes (not shown) in first substrate 20. The voltage regulation means may be implemented in several different ways well known in the art including as a linear or switching regulator circuit. In a preferred embodiment, a switching regulator is preferred since it has a higher efficiency and therefore dissipates less power (and heat).

The type of interconnection of electronic package assembly 10 shown in FIG. 2 works very well for applications intended to be used as an upgrade unit to plug into an existing pin-grid-array socket on an existing conducting member 40. For newly-developed applications, to overcome some of the limitations of typical pin-grid-array sockets (such as the ability to provide conductors on grids significantly smaller than 0.100-inch by 0.050-inch), it may be desirable to use a different method of connecting a package assembly. Such an approach is described below with respect to FIG. 3.

Figure 3:
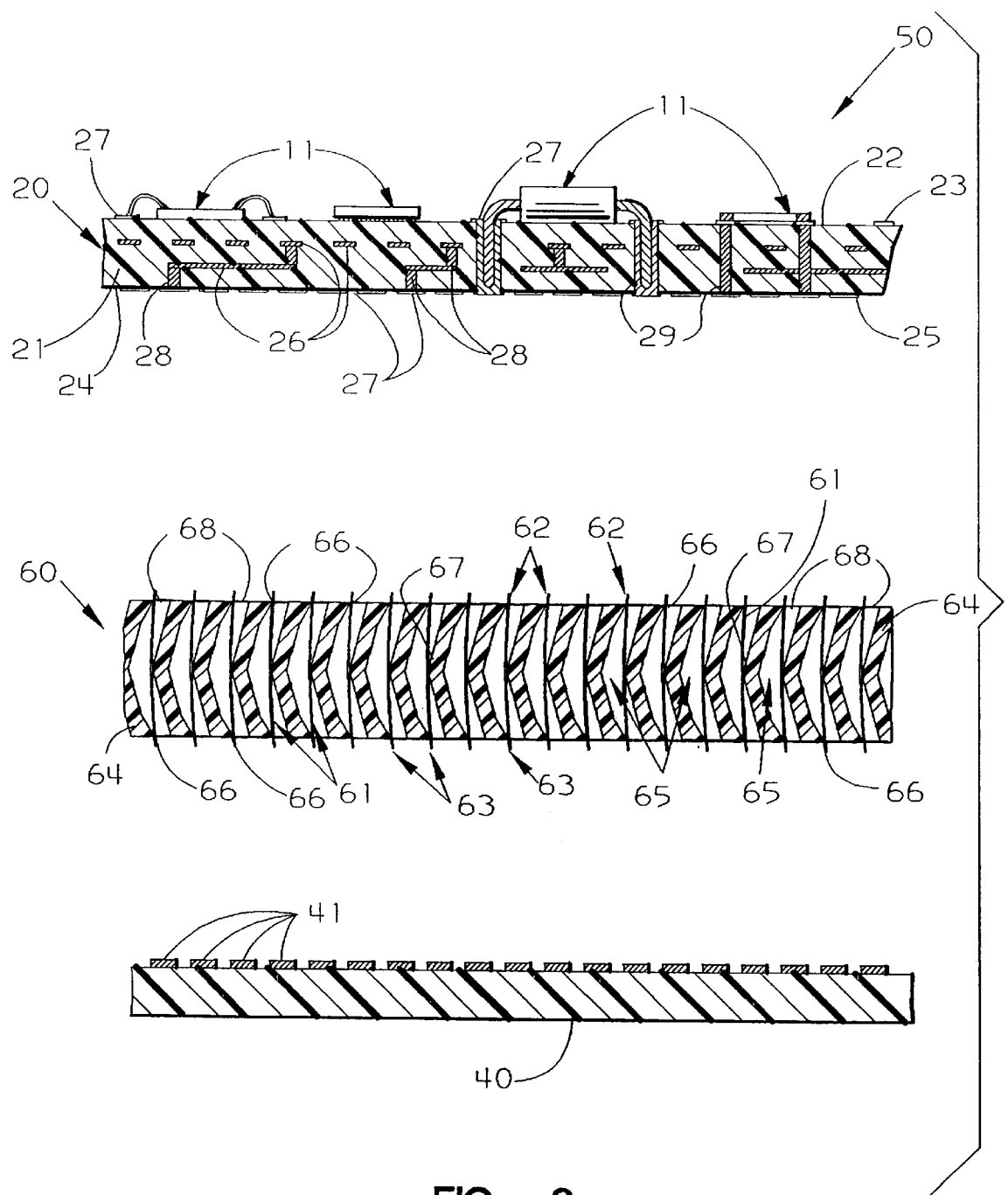
FIG. 3 illustrates, in a partial elevational side view, in section and on a larger scale over the view in FIG. 1, of an assembly in accordance with another embodiment of the invention.

In FIG. 3, second substrate 60 (including second conductor(s) 61) is of an interposer style. One example of this is described in U.S. Pat. No. 5,248,262, incorporated herein by reference. In addition to maintaining the advantages of a pinned array header as described above, the embodiment of FIG. 3 has several other advantages. Those advantages include the ability to support full area array connections on grids much denser than 0.100 inch, potentially better electrical performance, simpler assembly and rework (since the connector means may be clamped to first substrate 20, instead of permanently attached) while still allowing the interface with the conducting member 40 to be field-separable.

In FIG. 3, package assembly 50 is shown to include a first substrate 20, a second substrate 60 including at least one (and preferably a plurality of) second conductor(s) 61 therein, and at least one (and preferably several) electronic component(s) 11.

First substrate 20 is preferably similar to substrate 20 in FIG. 2, and thus includes a first surface 22 having an electrical pattern 23 thereon of a first density and a second, opposite surface 24 having an electrical pattern 25 thereon of a second density less than the first density.

Electronic package assembly 50 further includes a second dielectric substrate 60 and an array of second conductors 61 therein. In this embodiment, second substrate 60 and second conductor(s) 61 are implemented as an area array interposer-style connector. Such a connector may be implemented in many different ways. In one example, a dielectric elastomer may be used which includes therein a plurality of conductive paths, e.g., small diameter wires, small conductive traces, or a more or less columnar series of conductive (or conductively plated) material, to provide the necessary interconnections. In another example, a very fine (typically 0.001- to 0.002-inch diameter) gold-plated wire, typically of a material such as beryllium-copper, copper-silver, or molybdenum, is formed and compressed into a "button-like" contact that is inserted into one of a series of uniformly-spaced openings in the dielectric substrate.

In the example of FIG. 3, which is a preferred embodiment of this invention, second substrate 60 serves several functions, including as a protective housing for second conductors 61, and a structure for retaining and orienting second conductors 61 to ensure the proper alignment, engagement and successful connection of assembly 50. As stated, further description of substrate 60 and conductors 61 is found in U.S. Pat. No. 5,248,262.

Second substrate 60 (see FIG. 3) is of one or more parts, preferably molded of an electrically insulative, e.g., plastic material, and preferably of substantially rectangular configuration. In one example of the invention, second substrate 60 may possess a width (not shown) of about 2.3 inches and a combined thickness of only about 0.190 inch. The preferred material for second substrate 60 is plastic, with suitable examples of such material being Vectra (a trademark of Hoechst Celanese Corporation), Ryton (a trademark of Phillips Petroleum Company), phenolic and polyester.

Second substrate 60 preferably includes at least one elongated, electrically insulative positioning member 64 for each associated conductor 61. Each positioning member 64 preferably comprises a cross section that has a somewhat convex shape (as shown) on one of its vertical sides and a substantially concave shape on the opposite side, and is of polymer material (suitable examples of such material being the aforementioned Vectra, Ryton, phenolic and polyester materials). Substrate 60 is preferably manufactured by a process such as molding or extrusion, and held in position by clamping end parts (not shown). Such a clamping structure could simply include a C-shaped clamp or the like for engaging respective surfaces on members 20 and 40. Further description is not believed necessary. Adjacent positioning members 64 form a series of prestressed locations 65, each of which may be occupied by a conductor 61. Electrically insulative positioning members 64 are designed to contact second conductors 61 initially at two outer locating surfaces 66 and one inner locating surface 67, slightly deflecting the second conductors 61, and thereby retaining these conductors in a centered, slightly bowed, free-floating position. Each second conductor 61 is retained by friction between the three surfaces of contact (66 and 67) and the bowed second conductors 61. This slightly bowed form predisposes the bending direction of the second conductors 61 so that during the actuation of electronic package assembly 50, all of the second conductors 61 deflect in the same direction. Additionally, the outer surfaces 66 of each positioning member 64 and the somewhat convex-shaped part of the adjacent positioning member 64 immediately adjacent thereto define a pair of slots 68 through which respective opposing end portions 62 and 63 of each second conductor 61 project externally of the substrate's dielectric.

In a preferred embodiment, second conductors 61 may be of a conductive material such as beryllium-copper and may be formed either individually or as part of a larger group (such as a row of conductors formed as part of a flexible circuit) by a process such as stamping or etching. Beryllium-copper is the preferred material for second conductors 61 since it performs both the electrical functions of the second conductors 61 (e.g. provide conductive paths) while also providing the mechanical functions thereof, thus eliminating the need for separate springs means. Preferably, second conductors 61 (or at least opposing end portions 62 and 63) are plated with corrosion-resistant, sound conducting metallic material such as nickel, gold, silver, palladium, etc.

In a preferred embodiment, the series of second conductors 61 in second substrate 60 are on a 0.050-inch centers in both the X- and Y-dimensions, although even smaller center-to-center distances are possible. The dimensions of second conductors 61 may be varied to meet particular mechanical and electrical parameters. In one example, second conductors 61 are of beryllium-copper and possess a length of 0.200 inch, a width of 0.030 inch, and a thickness of 0.002 inch.

Significantly, second conductors 61 in FIG. 3, which act mechanically as buckling beams, allow for a narrow range of contact force over a wide range of vertical compliancy. For example, in one embodiment a vertical compliancy range of greater than 0.020 inch is achieved with less than a ten percent variation in force. In comparison, typical area array connectors have a usable vertical compliancy range of less than 0.010 inch over a variation in force of 100–300 percent. Additionally, the use of a buckling beam-type spring means for second conductors 61 allows the length of second conductors 61 to be reduced. This improves both the electrical (from both a signal and power carrying point of view) and thermal properties as well.

It is significant to note that opposing end portions 62 and 63 of second conductors 61 are at maximum force almost immediately after initially contacting first conductors 41 on conducting member 40 and electrical pattern 25 on the second surface 24 of first substrate 20, and substantially maintain that same force during the remainder of actuation. Additionally, since the second conductors 61 do not have to be overdriven to achieve minimum force per contact (such may be the case for conductors with larger force variation), second conductors 61 are able to minimize unnecessary clamping forces on conducting member 40.

As described, the interconnection of electronic package assembly 50 to conducting member 40 is made by the electrical coupling of contact pads 27 on the electrical pattern 25 on the second surface 24 of first substrate 20 to end portions 62 of second conductors 61, and end portions 63 of second conductors 61 to first conductors 41 (e.g., copper pads) located on conducting member 40. Although only one field-separable interface is required for an assembly to be field-separable, in the preferred implementation of this embodiment, the interfaces at both ends of second conductors 61 may be field-separable, thus allowing field replacement of second substrate 60 (and second conductors 61) if necessary.

Alignment of the above interfaces may be provided by utilizing a pair of protruding pins (not shown) which extend from one of the substrates (e.g., 20), these pins being aligned with and positioned within corresponding openings (not shown) within the other substrate (e.g., 60) and conducting member 40. It is understood that other means of alignment are readily possible, including the provision of pins extending from conducting member 40 for insertion within corresponding openings within both substrates 60 and 20. Although the actuation means for electronic package assembly 50 and conducting member 40 is not specifically shown, it is understood that such means may be accomplished by several methods well known in the art such as clamping, as mentioned above.

The functionality of the second substrate 60/second conductors 61 combination may be further enhanced by the inclusion of penetrating-type contact geometries such as dendritic elements (not shown) on the opposing end portions 62 and 63 of second conductors 61 to enhance the reliability of the connections by offering contact redundance, which in turn reduces contact resistance, heat dissipation, and the temperature in the contacts during operation. Furthermore, dendritic elements can break through dust, films, and fibrous debris that may be present on conductors such as those shown for conducting member 40. Such dendritic elements may be provided on the projecting end portions 62 and 63 in the manner taught in U.S. Pat. No. 5,237,743. Such elements may be formed on conductors 27, 41, as well as on selected portions (e.g., heads 32) of pins 31, in the manner defined in Canadian Patent No. 1,121,011. Both of these patents are also incorporated herein by reference.

To further enhance the connectivity of electronic package assembly 50 additional interconnections may be made through connectors or cables (not shown) located on and electrically coupled to the electrical patterns 23 and 25.

Although it is not specifically shown, to further enhance the capabilities of electronic package assembly 50, voltage regulation means may be included on first substrate 20 in a similar manner as defined for the embodiment in FIG. 2. Further description is not believed necessary.

Thus there has been shown and described an electronic package assembly capable of effectively and reliably connecting active as well as passive electronic components of different varieties and form factors (as well as supporting mechanical components) to an electrical circuit member, wherein such connections may be repeatable (such that connection and reconnection may readily occur). The invention is relatively inexpensive to manufacture and also of a relatively simplistic design, and provides several other advantageous features discernible from the above description.

While there have been shown and described what are at present considered the preferred embodiments of the invention, it will be obvious to those skilled in the art that various changes and modifications may be made therein without departing from the scope of the invention as defined by the appended claims.

What is claimed is:

1. An electronic package assembly for being electrically coupled to a conducting member having a plurality of first receiving conductors, said package assembly comprising:

a first substrate including a first surface having an electrical pattern thereon of a first density, a second surface having an electrical pattern thereon of a second density less than said first density, said electrical patterns on said first and second surfaces being electrically interconnected, and at least one layer of dielectric material located substantially between said first and second surfaces;

at least one electronic component electrically coupled to said electrical pattern on said first surface; and a second substrate including a dielectric member having a first surface and a plurality of second conductors therein and adapted for being positioned on said conducting member, said second conductors including a plurality of pins each including an enlarged head portion projecting above said first surface of said second substrate, said enlarged head portion having a downwardly facing shoulder abutting said first surface of said second substrate, selected ones of said head portions of said pins of said second substrate being directly coupled to said electrical pattern on said second surface of said first substrate and of a similar density as said second density, said second substrate assisting in the maintenance of a uniform height of the to surfaces of said head portions whereby connection to said electrical pattern on said second surface of said first substrate is aided, said pins further including projecting tail portions adapted for being positioned within and electrically coupled to respective ones of said first receiving conductors of said conducting member in a separable manner when said second substrate is positioned thereon, said second substrate assisting in the maintenance of a uniform spacing of said tail portions whereby connection to said first receiving conductors is assured, the dielectric material of said dielectric member and the dielectric material of said first substrate having substantially similar thermal coefficients of expansion.

2. The electronic package assembly according to claim 1 wherein said dielectric material is comprised of a fiberglass reinforced epoxy resin.

3. The electronic package assembly according to claim 1 wherein said electrical pattern on said first surface of said first substrate is of metallic material.

4. The electronic package assembly according to claim 3 wherein said metallic material is comprised of copper.

5. The electronic package assembly according to claim 3 wherein said electrical pattern on said first surface includes at least one conductive pad.

6. The electronic package assembly according to claim 1 wherein said electrical pattern on said second surface is of metallic material.

7. The electronic package assembly according to claim 6 wherein said metallic material is comprised of copper.

8. The electronic package assembly according to claim 6 wherein said electrical pattern includes at least one conductive pad.

9. The electronic package assembly according to claim 1 wherein said electronic component is electrically coupled to said electrical pattern on said first surface of said first substrate by soldering.

10. The electronic package assembly according to claim 1 wherein said dielectric material of both said dielectric member and said first substrate is comprised of a fiberglass reinforced epoxy resin.

11. The electronic package assembly according to claim 1 wherein said second conductors within said second substrate are comprised of metallic material.

12. The electronic package assembly according to claim 11 wherein said metallic material of said second conductors is comprised of brass.

13. The electronic package assembly according to claim 1 wherein said conductors within said second substrate are coupled to said electrical pattern on said second surface of said first substrate by soldering.

14. The electronic package assembly according to claim 1 further including voltage regulation means.

15. The electronic package assembly according to claim 14 wherein said voltage regulation means comprises a switching voltage regulator circuit.

16. The electronic package assembly according to claim 1 wherein said dielectric material of both said dielectric member and said first substrate is comprised of plastic.

17. The electronic package assembly according to claim 1 wherein said second conductors within said second substrate are comprised of metallic material.

18. The electronic package assembly according to claim 17 wherein said metallic material of said second conductors is comprised of beryllium-copper.

* * * * *